US011770164B2

(12) United States Patent
Resnati et al.

(10) Patent No.: US 11,770,164 B2
(45) Date of Patent: Sep. 26, 2023

(54) BYPASSABLE RADIO FREQUENCY FILTERS

(71) Applicant: CommScope Italy S.r.l., Agrate Brianza (IT)

(72) Inventors: Giuseppe Resnati, Seregno (IT); Alessandro Maurizio Delzanno, Milan (IT); Peter J. Bisiules, LaGrange Park, IL (US); XiaoHua Hou, Richardson, TX (US)

(73) Assignee: CommScope Italy S.r.l.

( * ) Notice: Subject to any disclaimer, the term of this patent is extended or adjusted under 35 U.S.C. 154(b) by 66 days.

(21) Appl. No.: 17/354,222

(22) Filed: Jun. 22, 2021

(65) Prior Publication Data
US 2022/0021429 A1 Jan. 20, 2022

Related U.S. Application Data

(60) Provisional application No. 63/053,093, filed on Jul. 17, 2020.

(30) Foreign Application Priority Data

Aug. 21, 2020 (IT) .................. 102020000020314

(51) Int. Cl.
H04B 1/03 (2006.01)
H04B 7/06 (2006.01)
(Continued)

(52) U.S. Cl.
CPC ........... *H04B 7/0602* (2013.01); *H01Q 1/246* (2013.01); *H01Q 1/42* (2013.01); *H03H 7/19* (2013.01);
(Continued)

(58) Field of Classification Search
CPC . H03H 7/19; H04B 1/005; H04B 1/03; H04B 1/12; H04B 1/18; H04B 1/44;
(Continued)

(56) References Cited

U.S. PATENT DOCUMENTS 6,104,934 A 8/2000 Patton et al.
7,831,213 B1 * 11/2010 Rausch .................. H04B 1/525
455/341

(Continued)

FOREIGN PATENT DOCUMENTS

| GB | 2482912 | * | 8/2010 |
| WO | 2014101340 A1 | | 7/2014 |
| WO | 2017165512 A1 | | 9/2017 |

OTHER PUBLICATIONS

Italian Search Report Corresponding to Italian Application No. 102020000020314 (11 pages) (dated May 13, 2021).
U.S. Appl. No. 63/024,846, filed May 14, 2020 to Hamdy et al.

Primary Examiner — Frank Duong
(74) Attorney, Agent, or Firm — Myers Bigel, P.A.

(57) ABSTRACT

Devices having bypassable radio frequency (RF) filters are provided. A device includes a bypassable RF filter and an adjustable-length RF transmission line that is coupled thereto. Moreover, the device includes a component that is coupled to the adjustable-length RF transmission line and is configured to change an electrical length of the adjustable-length RF transmission line between a first length and a second length. Related methods of bypassing the bypassable RF filter are also provided.

21 Claims, 15 Drawing Sheets

(51) Int. Cl.
    *H04B 1/18*    (2006.01)
    *H01Q 1/42*    (2006.01)
    *H04B 1/00*    (2006.01)
    *H03H 7/19*    (2006.01)
    *H01Q 1/24*    (2006.01)
(52) U.S. Cl.
    CPC .............. *H04B 1/005* (2013.01); *H04B 1/03* (2013.01); *H04B 1/18* (2013.01)
(58) Field of Classification Search
    CPC ... H04B 7/02; H04B 7/04; H04B 7/06; H04B 7/0602; H01Q 1/246; H01Q 1/42
    See application file for complete search history.

(56) References Cited

U.S. PATENT DOCUMENTS

| | | | |
|---|---|---|---|
| 9,602,098 B2* | 3/2017 | Prevost | H04B 1/0458 |
| 9,985,586 B2* | 5/2018 | Kim | H04B 1/38 |
| 10,270,485 B2* | 4/2019 | Sugaya | H03H 7/465 |
| 10,448,500 B2* | 10/2019 | Müller | H05K 7/1427 |
| 10,601,120 B2 | 3/2020 | Bisiules et al. | |
| 2002/0173343 A1 | 11/2002 | Narahashi et al. | |
| 2007/0008132 A1* | 1/2007 | Bellantoni | H01P 5/04 340/572.1 |
| 2020/0036406 A1 | 1/2020 | Pehlke et al. | |

* cited by examiner

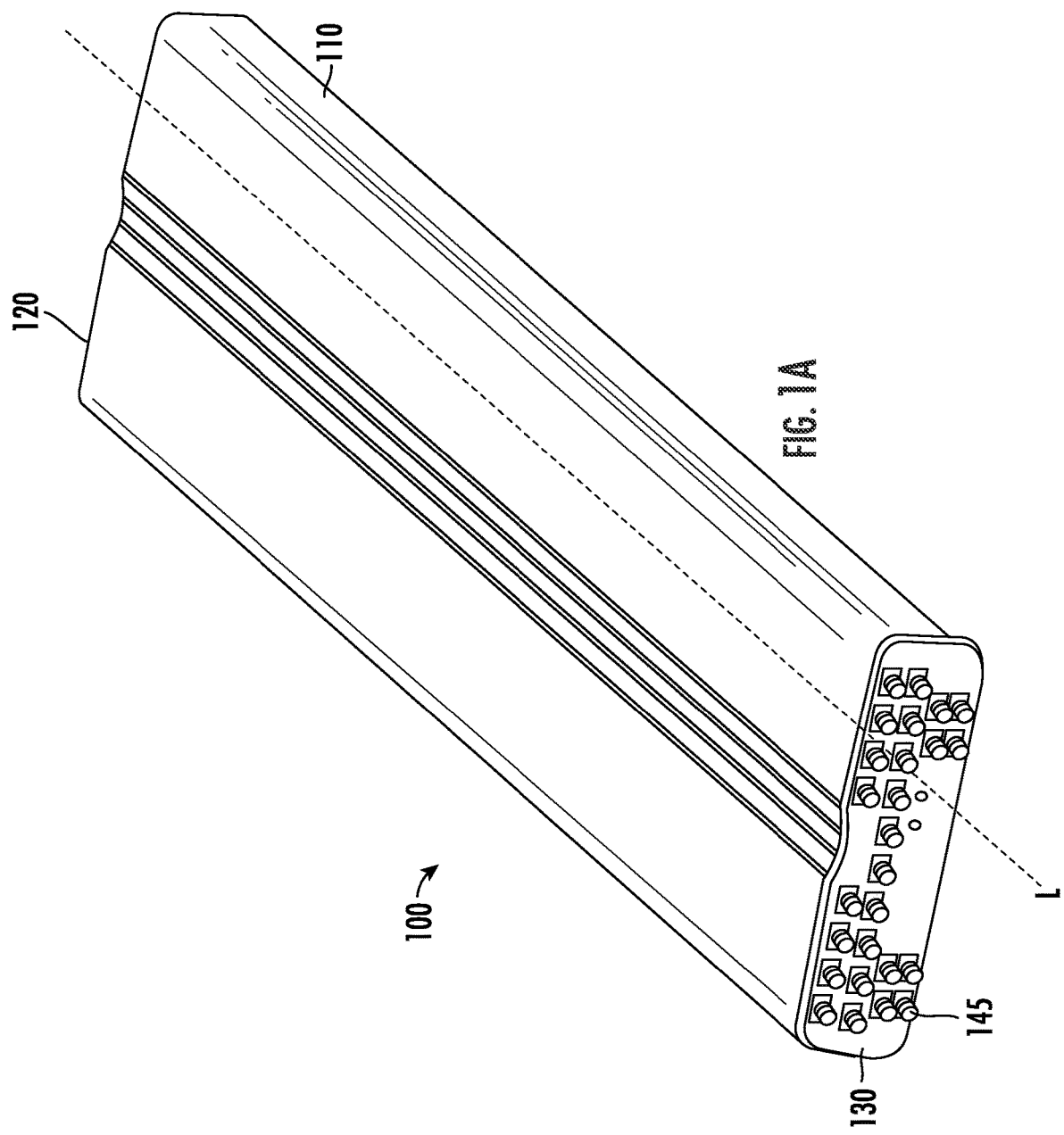

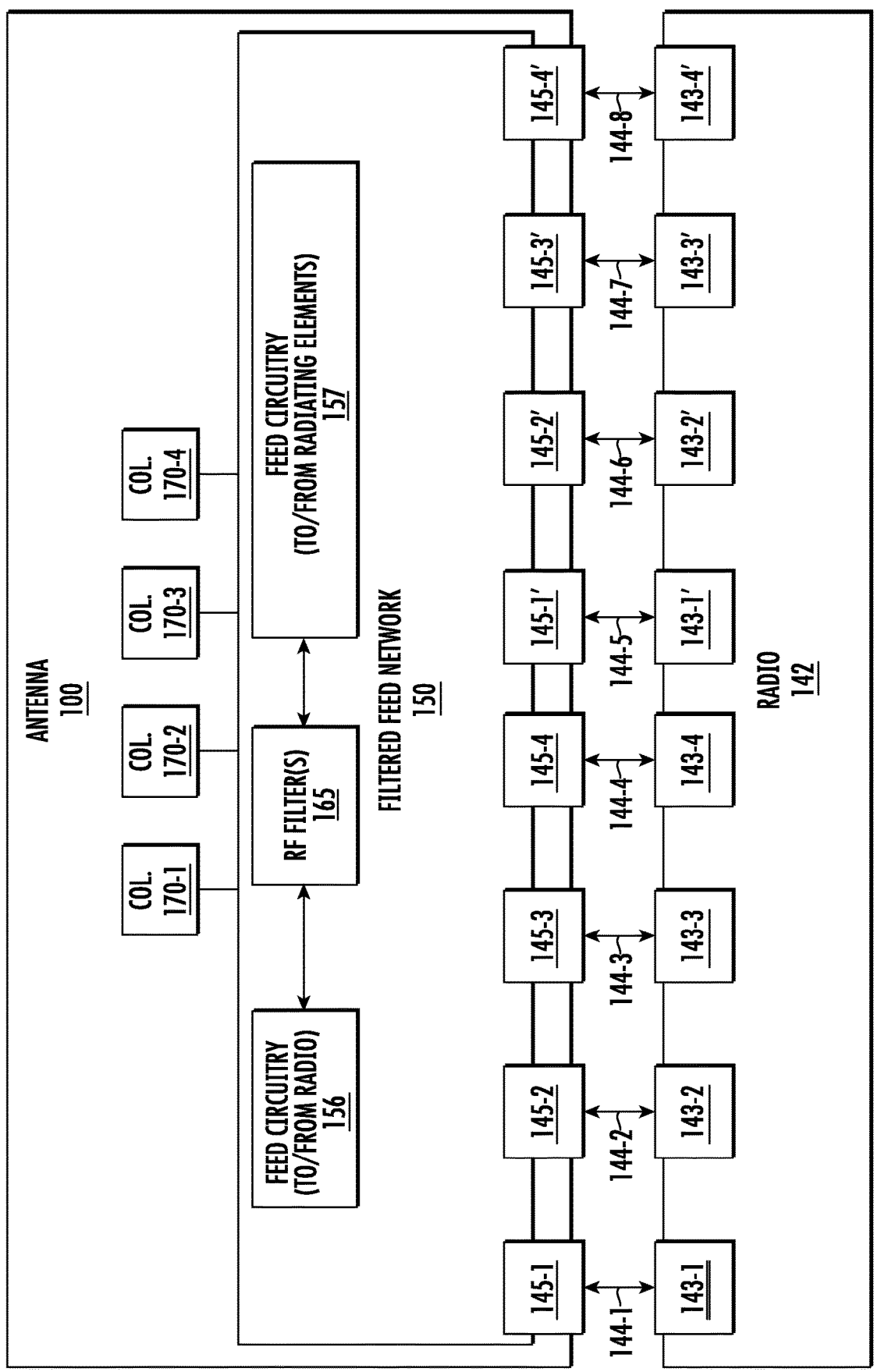

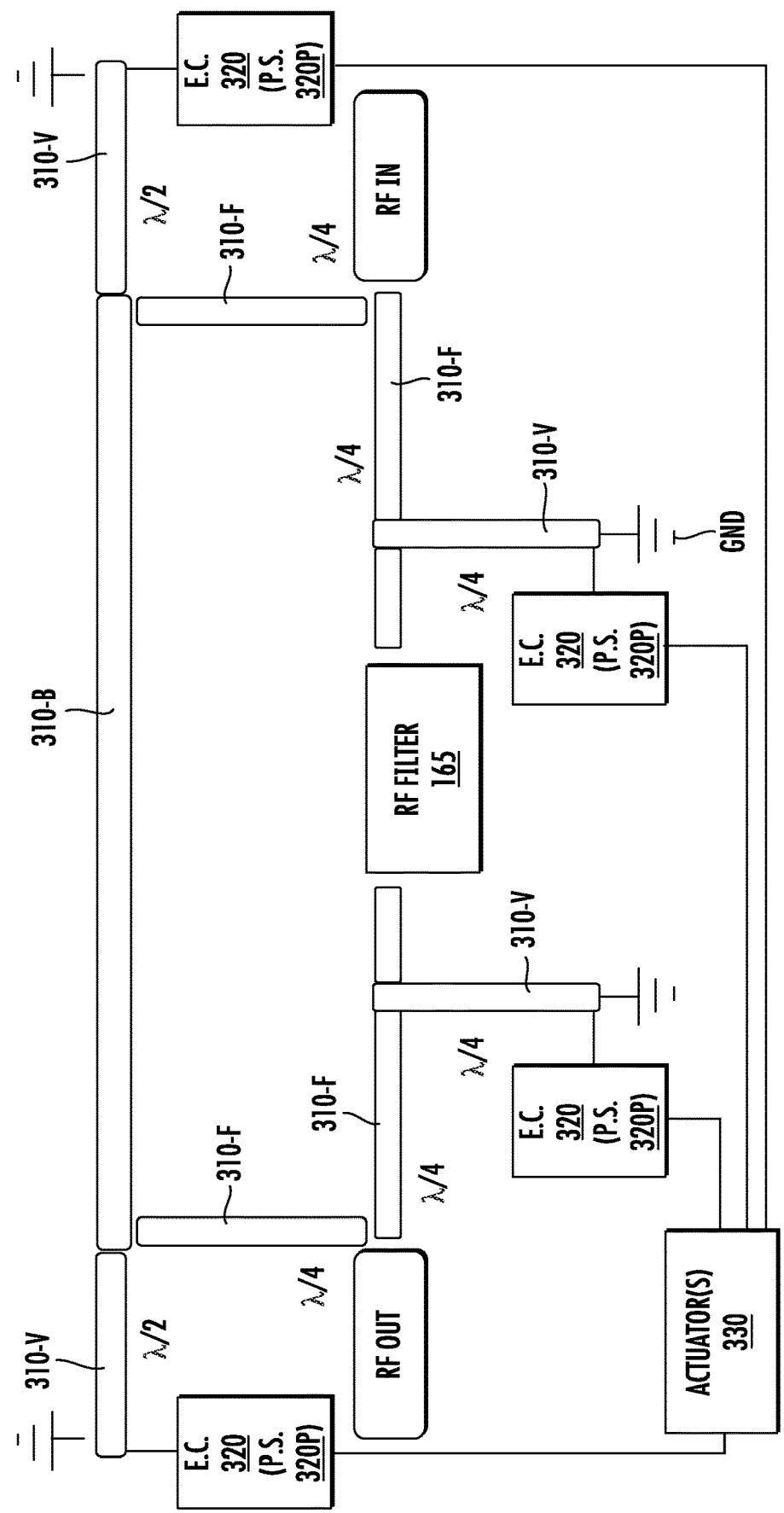

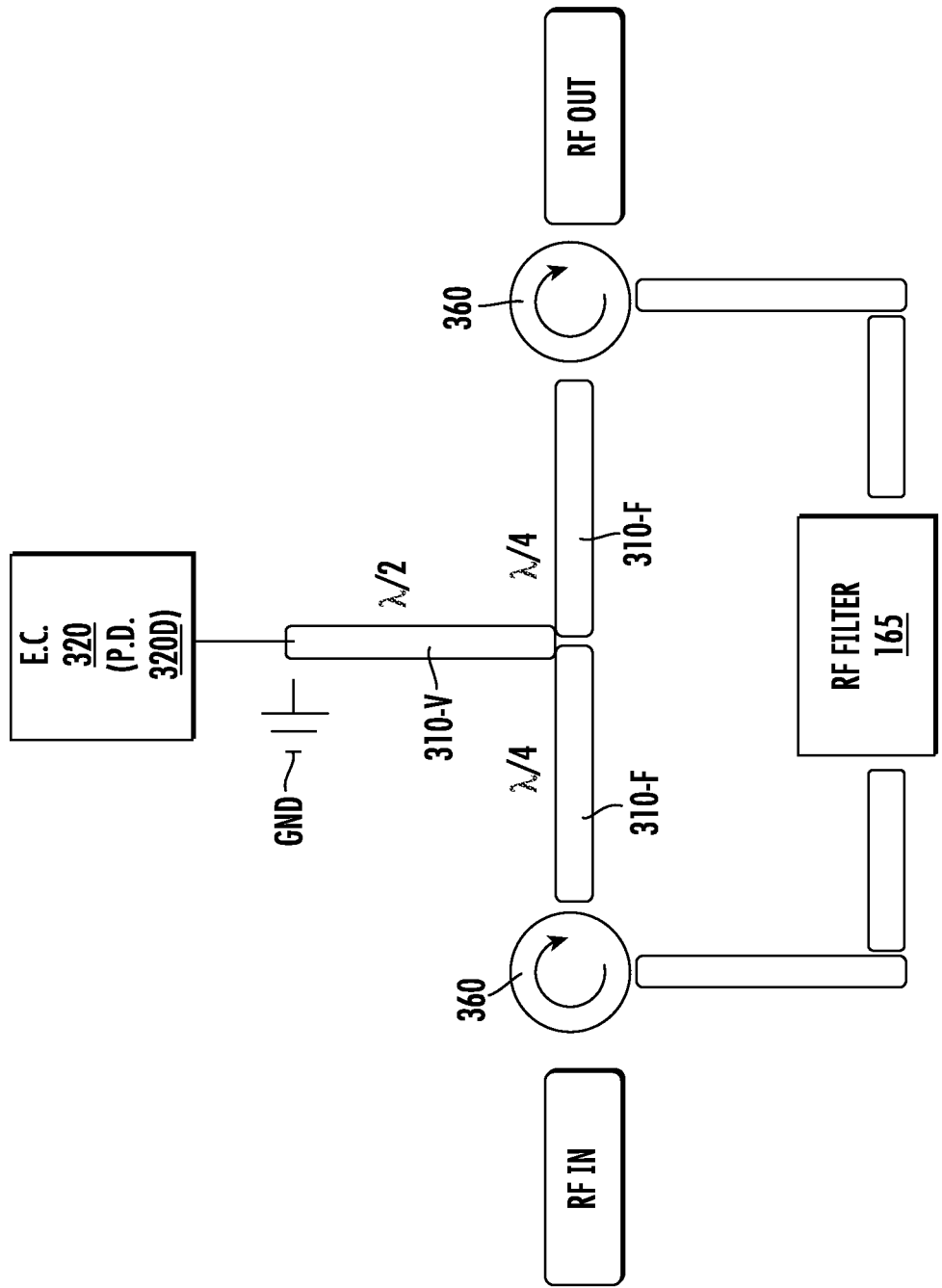

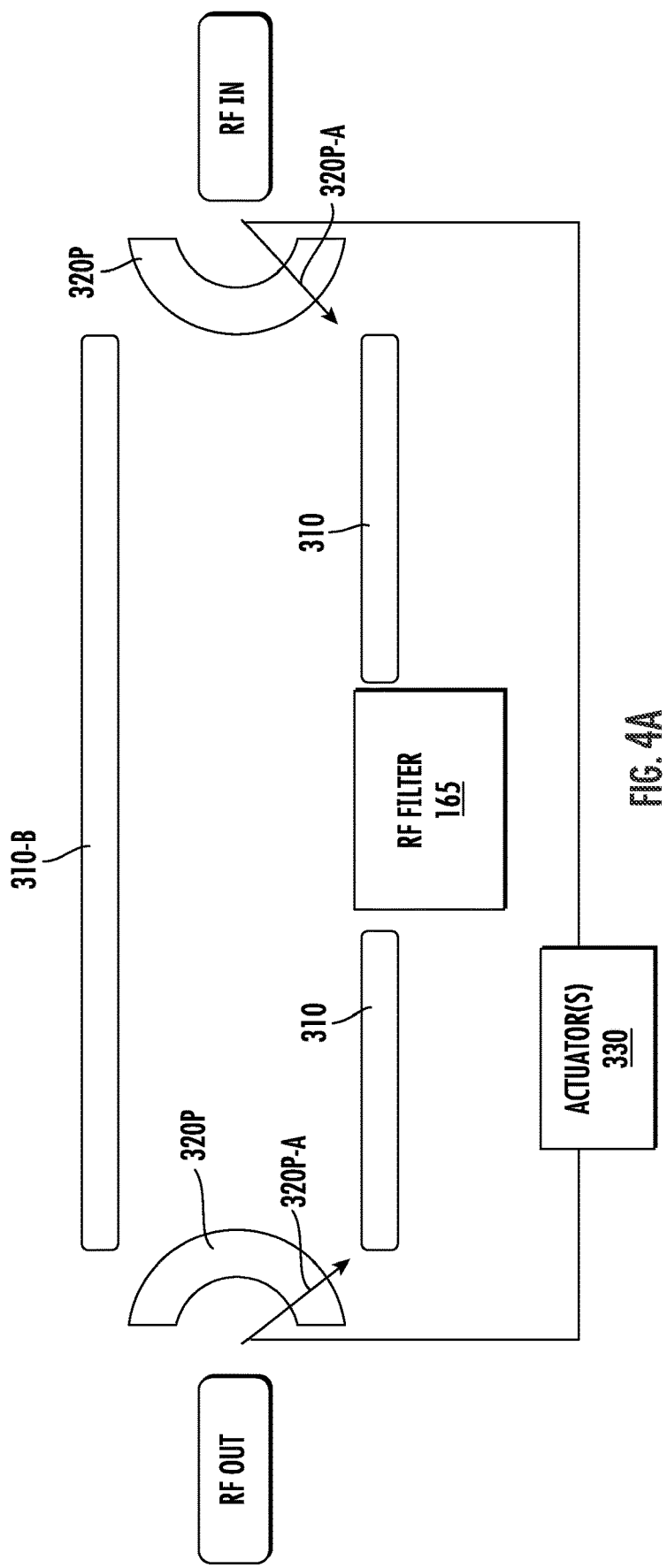

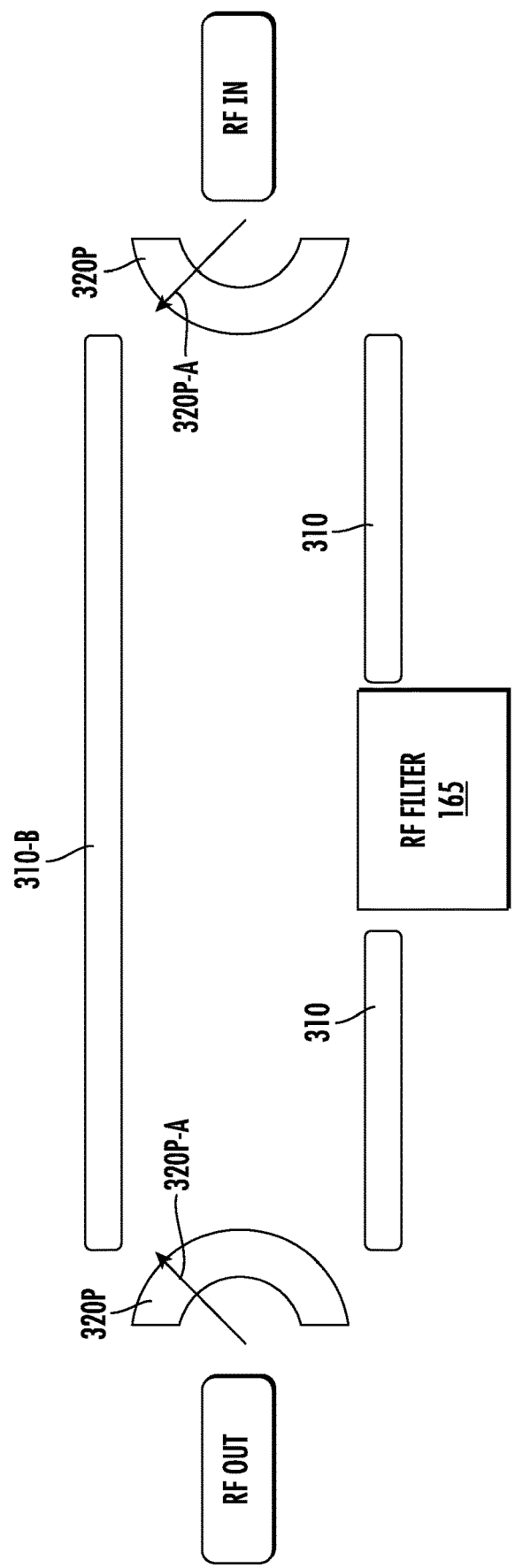

BYPASSABLE RADIO FREQUENCY FILTERS

CROSS-REFERENCE TO RELATED APPLICATIONS

The present application claims priority to U.S. Provisional Patent Application No. 63/053,093, filed Jul. 17, 2020, and Italian Patent Application No. 102020000020314, filed Aug. 21, 2020, the entire content of each of which is incorporated herein by reference.

FIELD

The present disclosure relates to communications systems and, in particular, to Radio Frequency ("RF") filters.

BACKGROUND

Base station antennas for wireless communications systems are used to provide cellular communications service to fixed and mobile users that are within defined coverage areas of the respective base station antennas. These base station antennas typically include one or more linear arrays or two-dimensional arrays of radiating elements, such as dipole, or crossed-dipole, radiating elements that act as individual antenna elements. Each of these arrays may be connected to one or more RF ports. The RF ports are used to pass RF signals between the arrays and one or more radios.

Example base station antennas are discussed in International Publication No. WO 2017/165512 to Bisiules, U.S. patent application Ser. No. 15/921,694 to Bisiules et al., and U.S. Patent Application No. 63/024,846 to Hamdy et al., the disclosures of which are hereby incorporated herein by reference in their entireties. Though it may be advantageous for a base station antenna to use an RF filter for a particular application of the antenna, use of the filter may be undesirable for another application (e.g., a different mode) of the antenna.

SUMMARY

A device, according to some embodiments herein, may include an RF signal input and an RF signal output. The device may include a bypassable RF filter that is coupled between the RF signal input and the RF signal output. The device may include an adjustable-length RF transmission line that is coupled to the bypassable RF filter. The device may include an electronic component that is coupled to the adjustable-length RF transmission line and is configured to change an electrical length of the adjustable-length RF transmission line between a first length and a second length. Moreover, the device may be configured to provide an RF signal that bypasses the bypassable RF filter when the adjustable-length RF transmission line has the second length and that does not bypass the bypassable RF filter when the adjustable-length RF transmission line has the first length.

In some embodiments, the electronic component may be a phase shifter or a PIN diode. Moreover, the second length may be double the first length or half of the first length.

According to some embodiments, the adjustable-length RF transmission line may be a first of a plurality of adjustable-length RF transmission lines that are coupled to the bypassable RF filter. Moreover, the electronic component may be a first of a plurality of electronic components that are coupled to and configured to change electrical lengths of the adjustable-length RF transmission lines, respectively.

In some embodiments, the device may include a resistive load that is coupled to the bypassable RF filter.

According to some embodiments, the bypassable RF filter may be a first of a plurality of bypassable RF filters of a filter stage, and the filter stage may further include a second of the bypassable RF filters. The device may further include an RF coupler that is coupled between the RF signal output and each of the first and the second of the bypassable RF filters. Moreover, the filter stage may be a first of a plurality of filter stages that are coupled between the RF signal input and the RF signal output.

In some embodiments, the device may further include an RF circulator that is coupled to the RF signal input or the RF signal output, and the adjustable-length RF transmission line may be coupled between the RF circulator and the electronic component. The RF circulator may be coupled to the RF signal input and may be a first of a plurality of RF circulators, and a second of the RF circulators may be coupled to the RF signal output. The bypassable RF filter may be coupled between the first and the second of the RF circulators, or the adjustable-length RF transmission line may be coupled between the bypassable RF filter and the first of the RF circulators. Moreover, the adjustable-length RF transmission line may be a first of a plurality of adjustable-length RF transmission lines, the bypassable RF filter may be a first of a plurality of bypassable RF filters, and the device may further include: a second of the bypassable RF filters; and a second of the adjustable-length RF transmission lines that is coupled between the second of the bypassable RF filters and the second of the RF circulators.

According to some embodiments, the device may be a base station antenna.

A method, according to some embodiments herein, may include bypassing an RF filter by changing an electrical length of an RF transmission line that is coupled to the RF filter. In some embodiments, the changing of the electrical length may be performed by adjusting a phase shifter that is coupled to the RF transmission line, or may be performed via a PIN diode that is coupled to the RF transmission line.

A device, according to some embodiments herein, may include first and second RF transmission paths between an RF signal input and an RF signal output. The device may include a bypassable RF filter that is in the first RF transmission path. The device may include a component, other than a solid-state switch and other than an electromechanical relay, that is coupled between the RF signal input and both of the first and second RF transmission paths. Moreover, the component may be configured to switch between coupling the RF signal input to the first RF transmission path and coupling the RF signal input to the second RF transmission path.

In some embodiments, the component may be a PIN diode or a switch including a wiper arm.

According to some embodiments, the component may be a first component, the device may further include a second component that is coupled between the RF signal output and both of the first and second RF transmission paths, and the second component may be configured to switch between coupling the RF signal output to the first RF transmission path and coupling the RF signal output to the second RF transmission path. Moreover, the second component may be configured to switch concurrently with the first component.

A base station antenna, according to some embodiments herein, may include a plurality of radiating elements. The base station antenna may include a bypassable RF filter that is coupled to a first of the radiating elements. The base station antenna may include an adjustable-length RF transmission line that is coupled to the bypassable RF filter. The base station antenna may include a component that is coupled to the adjustable-length RF transmission line and is configured to change an electrical length of the adjustable-length RF transmission line between a first length and a second length. Moreover, the base station antenna may be configured to provide an RF signal that bypasses the bypassable RF filter when the adjustable-length RF transmission line has the second length and that does not bypass the bypassable RF filter when the adjustable-length RF transmission line has the first length.

In some embodiments, the adjustable-length RF transmission line may be a first of a plurality of adjustable-length RF transmission lines, and the component may be a first of a plurality of phase shifters that are coupled to the adjustable-length RF transmission lines, respectively. Moreover, base station antenna may further include a RET actuator that is coupled to each of the phase shifters.

A device, according to some embodiments herein, may include an RF signal input and an RF signal output. The device may include a bypassable RF filter that is coupled between the RF signal input and the RF signal output. The device may include an adjustable-length RF transmission line that is coupled to the bypassable RF filter. The device may include a load that is coupled to the bypassable RF filter. Moreover, the bypassable RF filter may be configured to reflect RF energy in a first frequency band and to pass RF energy in a second frequency band to the load.

In some embodiments, the load may be a resistive load.

BRIEF DESCRIPTION OF THE DRAWINGS

FIG. 1A is a front perspective view of a base station antenna, according to embodiments of the present inventive concepts.

FIG. 1C is a schematic block diagram of ports of the base station antenna of FIG. 1A electrically connected to ports of the radio of FIG. 1B.

FIGS. 3A-3H are example schematic block diagrams of devices that include one or more of the RF filters of FIG. 1C.

FIGS. 4A and 4B are example schematic block diagrams illustrating a sequence of operating a device that includes one of the RF filters of FIG. 1C.

DETAILED DESCRIPTION

Figure 1B:
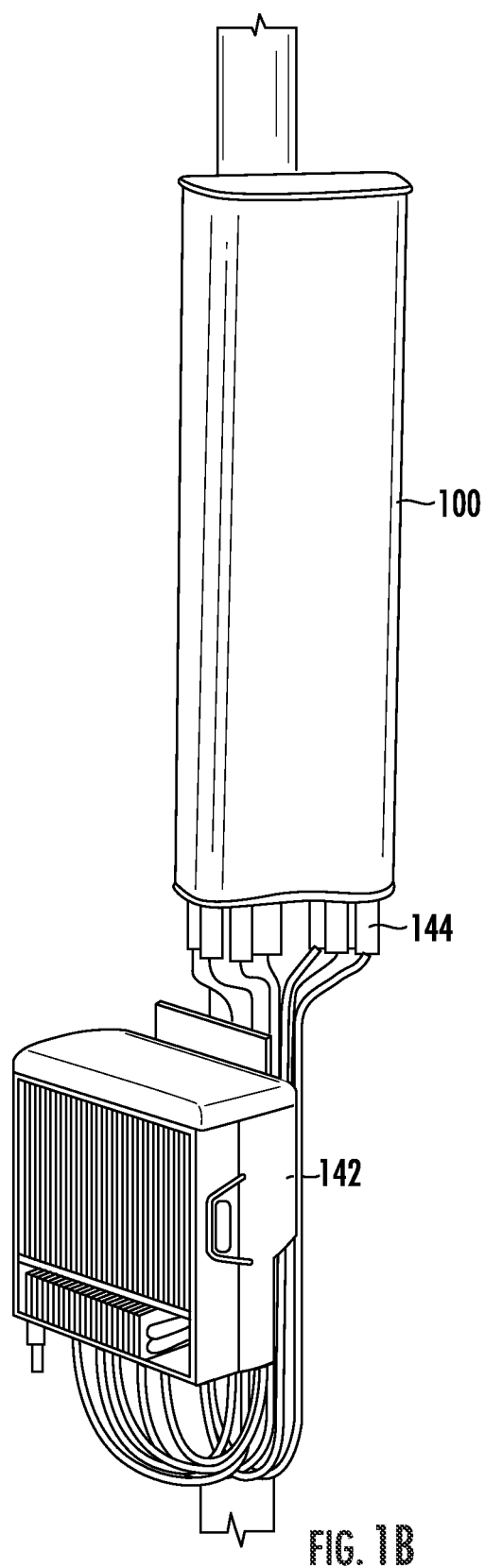
FIG. 1B is a front perspective view of the base station antenna of FIG. 1A electrically connected to a radio.

Pursuant to embodiments of the present inventive concepts, devices are provided that include bypassable RF filters. It may be desirable to bypass an RF filter that is integrated into a base station antenna or that is external to the antenna and interposed along the RF paths between the radio(s) and the antenna. In particular, though the filter may be advantageous for a given operation of the antenna, it may be desirable to omit use of the filter for another operation (e.g., a different mode) of the antenna. Moreover, some conventional switching techniques, such as the use of solid-state switches or electromechanical relays, may not be ideal for bypassing the filter. For example, a solid-state switch may disadvantageously require a direct current ("DC") feed and thus may consume a significant amount of current over the life of the filter. Due to poor linearity, solid-state switches may also introduce spurious signals that can interfere with adjacent RF systems. As for electromechanical relays, they may be prone to reliability problems, such as failing to switch after an extended period of inactivity.

According to the present inventive concepts, however, a device that includes a bypassable RF filter can route RF signals through the filter during a first mode of operation and can bypass the filter during a second mode of operation. Specifically, the device may further include an electronic (and/or mechanical) component, other than a solid-state switch and other than an electromechanical relay, that is configured to switch between the two modes. For example, the electronic/mechanical component may be configured to switch between the modes by adding or subtracting electrical length to/from an adjustable-length RF transmission line that is coupled to the filter. As a result, the transmission line can change between (i) blocking a bypass RF transmission path that otherwise would bypass the filter and (ii) enabling the bypass path to electrically connect to an RF signal input/output.

In some embodiments, an electrical short circuit (e.g., full or almost full reflection of an RF signal) can be provided at a particular circuit node/point by using a transmission line that has an electrical length that is an integer multiple of 180 degrees. By contrast, the same transmission line can provide an electrical open circuit (i.e., an electrical disconnection) at the node/point by adding or subtracting 90 degrees to/from the electrical length of the RF transmission path. For example, a phase shifter (or other electronic/mechanical component) can be used to change the electrical length. As an example, the phase shifter may be controlled by a remote electrical tilt ("RET") actuator, which may operate based on Antenna Interface Standards Group ("AISG") commands. Accordingly, various devices according to the present inventive concepts can bypass RF filters by changing electrical lengths of transmission lines.

Example embodiments of the present inventive concepts will be described in greater detail with reference to the attached figures.

FIG. 1A is a front perspective view of a base station antenna 100, according to embodiments of the present inventive concepts. The antenna 100 may be, for example, a cellular base station antenna at a macrocell base station or at a small cell base station. As shown in FIG. 1A, the antenna 100 is an elongated structure and has a generally rectangular shape. The antenna 100 includes a radome 110. In some embodiments, the antenna 100 further includes a top end cap 120 and/or a bottom end cap 130. The bottom end cap 130 may include a plurality of RF connectors 145 mounted therein. The connectors 145, which may also be referred to herein as "ports," are not limited, however, to being located on the bottom end cap 130. Rather, one or more of the connectors 145 may be provided on, for example, the rear (i.e., back) side of the radome 110 that is opposite the front side of the radome 110. The antenna 100 is typically mounted in a vertical configuration (i.e., the long side of the antenna 100 extends along a vertical axis L with respect to Earth).

FIG. 1B is a front perspective view of the base station antenna 100 electrically connected to a radio 142 by RF transmission lines 144, such as coaxial cables. For example, the radio 142 may be a cellular base station radio, and the antenna 100 and the radio 142 may be located at (e.g., may be components of) a cellular base station.

FIG. 1C is a schematic block diagram of ports 145 of the base station antenna 100 electrically connected to respective ports 143 of the radio 142. As shown in FIG. 1C, ports 145-1 through 145-4 of the antenna 100 are electrically connected to ports 143-1 through 143-4, respectively, of the radio 142 by respective RF transmission lines 144-1 through 144-4, such as coaxial cables. Similarly, ports 145-1' through 145-4' of the antenna 100 are electrically connected to ports 143-1' through 143-4', respectively, of the radio 142 by respective RF transmission lines 144-5 through 144-8. The ports 145-1 through 145-4 may transmit and/or receive RF signals in the same frequency band as the ports 145-1' through 145-4', or in a different frequency band from the ports 145-1' through 145-4'. For simplicity of illustration, only eight ports 145 are shown in FIG. 1C. In some embodiments, however, the antenna 100 may include twelve, twenty, thirty, or more ports 145. Moreover, though all of the ports 143 are shown as being part of a single radio 142, it will be appreciated that the ports 143 may alternatively be spread across multiple radios 142.

The antenna 100 may transmit and/or receive RF signals in one or more frequency bands, such as one or more bands comprising frequencies between 3,550 megahertz ("MHz") and 4,200 MHz. For example, the antenna 100 may transmit and/or receive RF signals in three or more different bands, including a first band comprising frequencies between 3,550 MHz and 3,700 MHz, a second band comprising frequencies between 3,700 MHz and 4,000 MHz, and a third band comprising frequencies between 4,000 MHz and 4,200 MHz. Moreover, the antenna 100 may, in some embodiments, transmit and/or receive RF signals in a portion of one of those bands, such as a first portion comprising frequencies between 3,700 MHz and 3,800 MHz, while rejecting RF signals in another portion, such as a second portion comprising frequencies between 3,820 MHz and 3,980 MHz.

The antenna 100 may include arrays (e.g., vertical columns) 170-1 through 170-4 of radiating elements that are configured to transmit and/or receive RF signals. The antenna 100 may also include a filtered feed network 150 that is coupled between the arrays 170 and the radio 142. For example, the arrays 170 may be coupled to respective RF transmission paths (e.g., including one or more RF transmission lines) of the feed network 150.

Moreover, the feed network 150 may include one or more RF filters 165. Feed circuitry 156 of the feed network 150 may be coupled between the RF filter(s) 165 and the radio 142. Also, feed circuitry 157 of the feed network 150 may be coupled between the RF filter(s) 165 and the arrays 170. The circuitry 156, 157 can couple downlink RF signals from the radio 142 to radiating elements that are in arrays 170. The circuitry 156, 157 may also couple uplink RF signals from radiating elements that are in arrays 170 to the radio 142. For example, the circuitry 156, 157 may include power dividers, RF switches, RF couplers, and/or RF transmission lines that couple the RF filter(s) 165 between the radio 142 and the arrays 170. Moreover, as discussed in more detail herein with respect to FIGS. 3A-4B, RF couplers, RF circulators, and/or at least one RF transmission line of the circuitry 156, 157 may be configured to route RF signals along an RF transmission path that bypasses the RF filter(s) 165.

The antenna 100 may also include phase shifters that are used to electronically adjust the tilt angle of the antenna beams generated by each array 170. The phase shifters may be located at any appropriate location along the RF transmission paths that extend between the ports 145 and the arrays 170. Accordingly, though omitted from view in FIG. 1C for simplicity of illustration, the filtered feed network 150 may include phase shifters.

Figure 2:
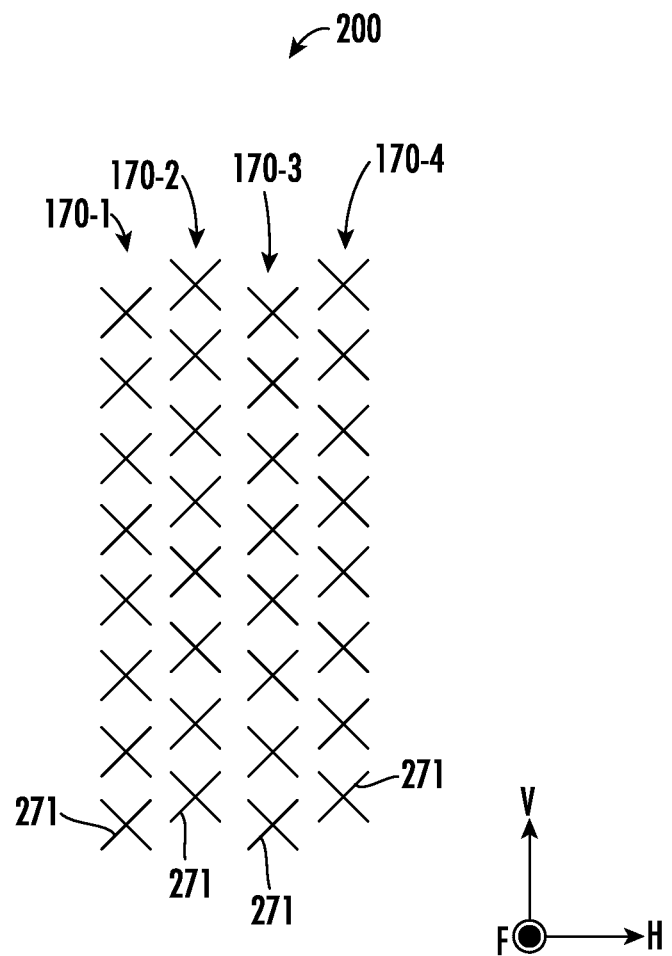
FIG. 2 is an example schematic front view of the base station antenna of FIG. 1A with the radome removed.

FIG. 2 is an example schematic front view of the base station antenna 100 of FIG. 1A with the radome 110 thereof removed to illustrate an antenna assembly of the antenna 100. The antenna assembly includes a plurality of radiating elements 271, which may be grouped into one or more arrays 170.

For example, FIG. 2 shows an antenna assembly 200 including four arrays 170-1 through 170-4 of radiating elements 271 in four vertical columns, respectively, that are spaced apart from each other in a horizontal direction H. Vertical columns of radiating elements 271 may extend in a vertical direction V from a lower portion of the antenna assembly 200 to an upper portion of the antenna assembly 200. The vertical direction V may be, or may be parallel with, the longitudinal axis L (FIG. 1A). The vertical direction V may also be perpendicular to the horizontal direction H and a forward direction F. As used herein, the term "vertical" does not necessarily require that something is exactly vertical (e.g., the antenna 100 may have a small mechanical down-tilt). For simplicity of illustration, the feed circuitry 157 (FIG. 1C) that is coupled to the antenna assembly 200 is omitted from view in FIG. 2.

The arrays 170 are each configured to transmit and/or receive RF signals in one or more frequency bands, such as one or more bands comprising frequencies between 3,550 MHz and 4,200 MHz. Though FIG. 2 illustrates four arrays 170-1 through 170-4, the antenna assembly 200 may include more (e.g., five, six, or more) or fewer (e.g., three, two, or one) arrays 170. Moreover, the number of radiating elements 271 in an array 170 can be any quantity from two to twenty or more. For example, the four arrays 170-1 through 170-4 shown in FIG. 2 may each have five to twenty radiating elements 271. In some embodiments, the arrays 170 may each have the same number (e.g., eight) of radiating elements 271.

FIGS. 3A-3H are example schematic block diagrams of devices that include one or more RF filters 165 of FIG. 1C. In some embodiments, the filter(s) 165 may be integrated into a base station antenna 100 (FIG. 1A), such as in a feed network 150 (FIG. 1C) thereof. Accordingly, the antenna 100 may be referred to herein as a "device" that includes the filter(s) 165. In other embodiments, the filter(s) 165 may be external to the antenna 100. For example, the filter(s) 165 may be mounted on a base station antenna tower. As an example, a standalone unit that is coupled between a radio 142 (FIG. 1B) and the antenna 100 may comprise the filter(s) 165.

Moreover, the filter(s) 165 may be referred to herein as "bypassable" because at least one RF transmission line 310 and circuitry coupled thereto may be configured to route RF signals along an RF transmission path that bypasses the filter(s) 165. As a result, a wider frequency band can be used by an array 170 (FIG. 1C) of radiating elements and the radio 142 that are coupled to the filter(s) 165.

As shown in FIG. 3A, a bypassable RF filter 165 may be coupled between an RF signal input RF IN and an RF signal output RF OUT. For example, the input RF IN may provide downlink RF signals from the radio 142 to the filter 165, and the output RF OUT may provide filtered downlink RF signals that are output from the filter 165 to one or more radiating elements (e.g., of an array 170) of the antenna 100. The input RF IN and the output RF OUT may not be limited, however, to inputting and outputting, respectively, downlink RF signals. Rather, the output RF OUT may serve as an RF signal input that provides uplink RF signals from the radiating element(s) to the filter 165, and the input RF IN may likewise serve as an RF signal output that provides filtered uplink RF signals that are output from the filter 165 to the radio 142. Accordingly, the input RF IN and the output RF OUT may be respective bidirectional ports that are coupled to the radio 142 and the array 170, respectively.

RF transmission lines 310 may couple the filter 165 to the input RF IN and the output RF OUT. Moreover, other lines 310, including a bypass RF transmission line 310-B, between the input RF IN and the output RF OUT may provide a bypass RF transmission path that bypasses the filter 165. The bypass path may be selected by changing an electrical length of one or more of the lines 310. In particular, the lines 310 may comprise (i) fixed-length RF transmission lines 310-F having respective electrical lengths that do not change and (ii) adjustable-length RF transmission lines 310-V having respective electrical lengths that vary in response to signals/settings at electronic (and/or mechanical) components 320 coupled thereto.

For example, the components 320 may be configured to increase and/or decrease the respective electrical lengths of the lines 310-V coupled thereto, such as by adding or subtracting 90 degrees of electrical length. As an example, the components 320 may double one or more of the electrical lengths, such as from one-quarter of a wavelength (i.e., 90 degrees) of an RF signal at the input RF IN to one-half of the wavelength (i.e., 180 degrees), and/or reduce one or more of the electrical lengths by half, such as from one-half of the wavelength to one-quarter of the wavelength. By contrast, the lines 310-F may always have electrical lengths of one-quarter of the wavelength when the RF signal is provided in a desired/predetermined frequency band.

In a first mode (FIG. 3A) of the device that includes the filter 165, two lines 310-V that are closest to the filter 165 may also have electrical lengths of one-quarter of the wavelength, whereas another two lines 310-V that are farther from the filter 165 may have electrical lengths of one-half of the wavelength. Each of the two lines 310-V that are farther from the filter 165 may have a first end that is electrically shorted to ground GND and an opposite, second end that is coupled to a respective end of the line 310-B. As a result, the RF signal at the input RF IN is routed through (i.e., does not bypass) the filter 165.

In particular, the electrical lengths of the two lines 310-V that are farther from the filter 165 operate/function to electrically short those two lines 310-V to ground GND, thus facilitating full (or almost full) reflection of the RF signal at those two lines 310-V and opening (i.e., electrically disconnecting) the circuit at the two lines 310-F that are coupled between the line 310-B and the input RF IN and output RF OUT, respectively, to thereby interrupt a connection to the line 310-B. Mismatches in electrical length (e.g., one-half of a wavelength versus one-quarter of the wavelength) at junctions between those two lines 310-V and those two lines 310-F, respectively, can cause those two lines 310-F to operate/function as open circuit points. In general, RF signals flow where they find lower impedance. A short-circuit point/node can be provided by a very low impedance transition to a following (i.e., an adjoining, subsequent) line 310 (e.g., a 50-Ohm transmission line), and an open-circuit point/node can be provided by a very high impedance transition to the following line 310. When an open-circuit point/node or a short-circuit point/node is at the end of an RF transmission path (e.g., at a line 310-V that is physically shorted to ground GND), both the open-circuit point/node and the short-circuit point/node can provide a complete (or almost complete) signal reflection, with just a 90-degree phase difference between the open-circuit scenario and the short-circuit scenario. Moreover, each line 310-V is physically directly connected to ground GND, which may be, for example, a wide metallized area that is connected to a printed circuit board ("PCB") ground plane through metallized through holes.

By contrast with the first mode (FIG. 3A), in a second mode (FIG. 3B) of the device, electrical lengths of the two lines 310-V that are closest to the filter 165 may double (e.g., to be twice electrical lengths of the lines 310-F), whereas electrical lengths of the other two lines 310-V that are farther from the filter 165 may be cut in half (e.g., to be equal to electrical lengths of the lines 310-F). The two lines 310-V that are farthest from the filter 165 may thereby provide open-circuit points that do not interrupt the bypass path, thus allowing the RF signal to bypass the filter 165 by passing through the line 310-B. Specifically, though physically short circuited to respective lines 310-F, those two lines 310-V may operate/function as open-circuit points between the bypass path and ground GND when the RF signal is provided to the lines 310-V.

In some embodiments, the filter 165 may be coupled to an adjacent line 310-V or 310-F by a much shorter RF transmission line. An electrical length of the shorter line may not have a significant impact on the functioning of the circuit.

The components 320 may comprise, for example, respective phase shifters 320P or respective PIN diodes 320D (FIG. 3E). As an example, each phase shifter 320P may have first and second settings. When the phase shifter 320P is set at the first setting, an electrical length of the respective transmission line 310-V may be one-quarter of the wavelength. When the phase shifter 320P is set at the second setting, an electrical length of the respective transmission line 310-V may be one-half of the wavelength. Thus, each phase shifter 320P may be used to change the electrical length of a respective line 310-V coupled thereto. In some embodiments, the lines 310 and/or the components 320 may be included among feed circuitry 156, 157 (FIG. 1C) of the device, which may be the antenna 100 or a standalone module/unit that is external to the antenna 100.

The components 320 may, in some embodiments, be coupled to one or more actuators 330. For example, the components 320 may be respective phase shifters 320P that are coupled to actuators, respectively. As another example, all of the phase shifters 320P may be coupled to the same actuator. Accordingly, a single actuator may be configured to concurrently move all (e.g., four) of the phase shifters 320P. Moreover, as the device may include multiple filters 165, a single actuator may, in some embodiments, concurrently move eight, twelve, sixteen, or more phase shifters 320P. In other embodiments, such as those in which PIN diodes 320D are used, the actuator(s) 330 may be unnecessary and thus omitted.

The phase shifters 320P may be, for example, rotational phase shifters, such as wiper phase shifters. As another example, the phase shifters 320P may be non-rotational phase shifters. For example, a non-rotational phase shifter may be a trombone phase shifter or a sliding dielectric phase shifter. In some embodiments, four trombone sections can change between one-half of the wavelength and one-quarter of the wavelength, and can replace the four phase shifters 320P that are shown in FIG. 3A.

FIG. 3A further illustrates that a first end of each of the lines 310-V may be physically shorted to ground GND. Moreover, a second end of each of the lines 310-V may be coupled to (e.g., electrically connected to) the filter 165. The second end may be opposite the first end.

In some embodiments, the filter 165 may be a notch filter for rejection of particular frequencies. For example, the filter 165 may be configured to provide about 30 decibels ("dB") of rejection, such as to block frequencies between 3.82 gigahertz ("GHz") and 3.98 GHz or other 5G cellular frequencies. As a result, an out-of-band spurious emission that is generated by a 5G cellular radio (e.g., the radio 142) may be reduced from −13 dB-milliwatt ("dBm")/MHz to −43 dBm/MHz in the 3.82-3.98 GHz band at a node/port, such as the port 145 (FIG. 1A) or another node, of the antenna 100. Considering antenna gain (e.g., a 10 dB maximum) and a minimum separation (e.g., 95 dB provided by 300 meters of separation) to a victim antenna, the out-of-band spurious emission may be −128 dBm/MHz at the victim antenna. The victim antenna may operate at, for example, frequencies between 4 GHz and 4.2 GHz.

When the filter 165 is bypassed, the otherwise-rejected 3.82-3.98 GHz band becomes part of a widened passband. For example, a passband of 3.7-3.8 GHz may be widened to 3.7-3.98 GHz. Moreover, the widened passband may include a frequency band, such as 3.80-3.82 GHz, that serves as a guard band when the filter 165 is used.

Figure 3B:
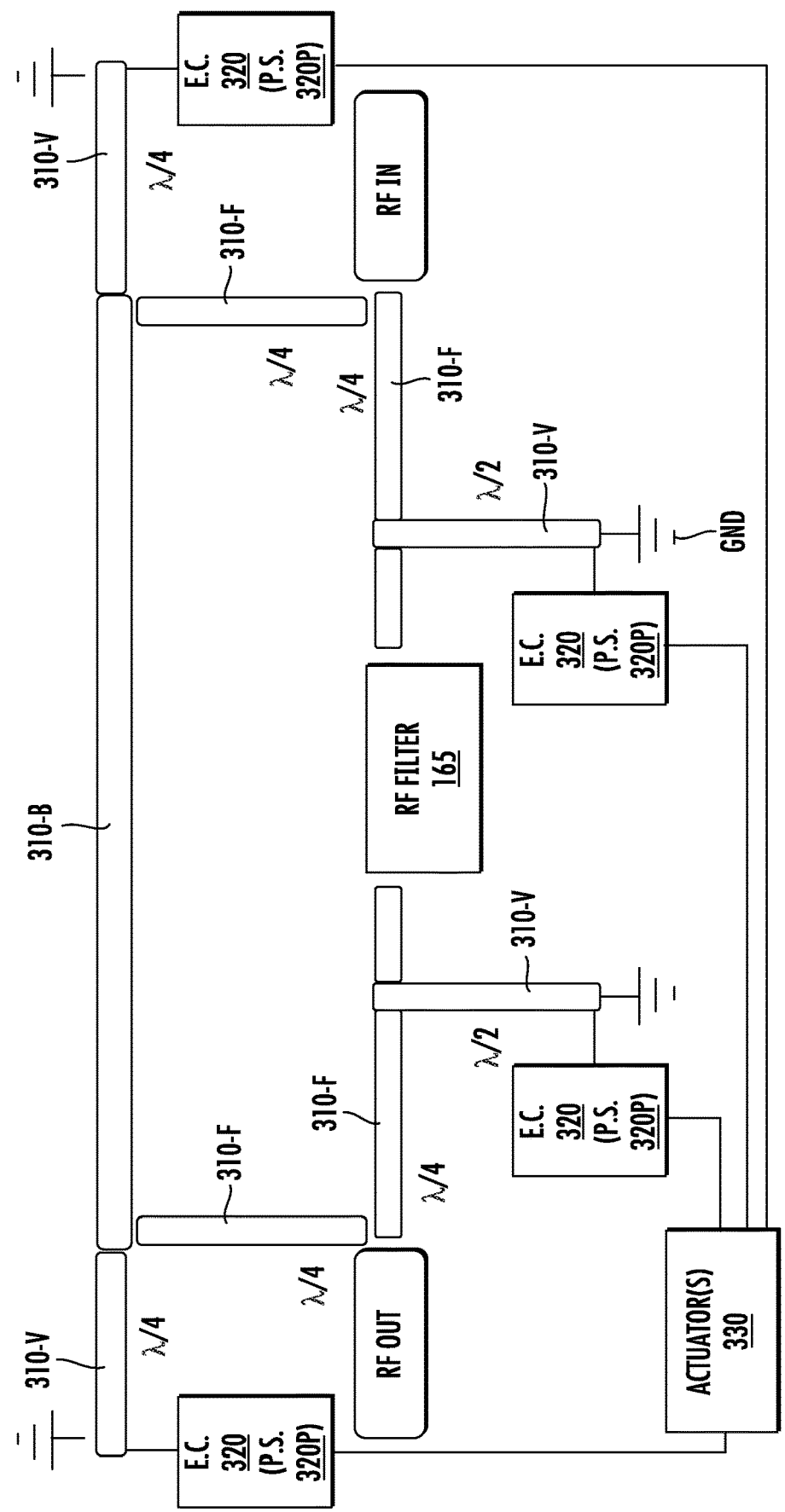

Referring to FIGS. 3A and 3B together, an example sequence is shown in which electrical lengths of the lines 310-V change by one-quarter of a wavelength. Each change is indicated by a transition of the symbol λ/4 (which represents one-quarter of a wavelength or an odd integer multiple thereof) to the symbol λ/2 (which represents one-half of a wavelength or another even integer multiple of one-quarter of the wavelength), or vice versa. FIGS. 3A and 3B illustrate through-filter and bypass modes, respectively, and the sequence of transitioning between these two modes can begin with either mode and finish with the other. In the through-filter mode, an electrical connection to the line 310-B can be interrupted due to an electrical length of one or more of the lines 310-V.

Figure 3C:
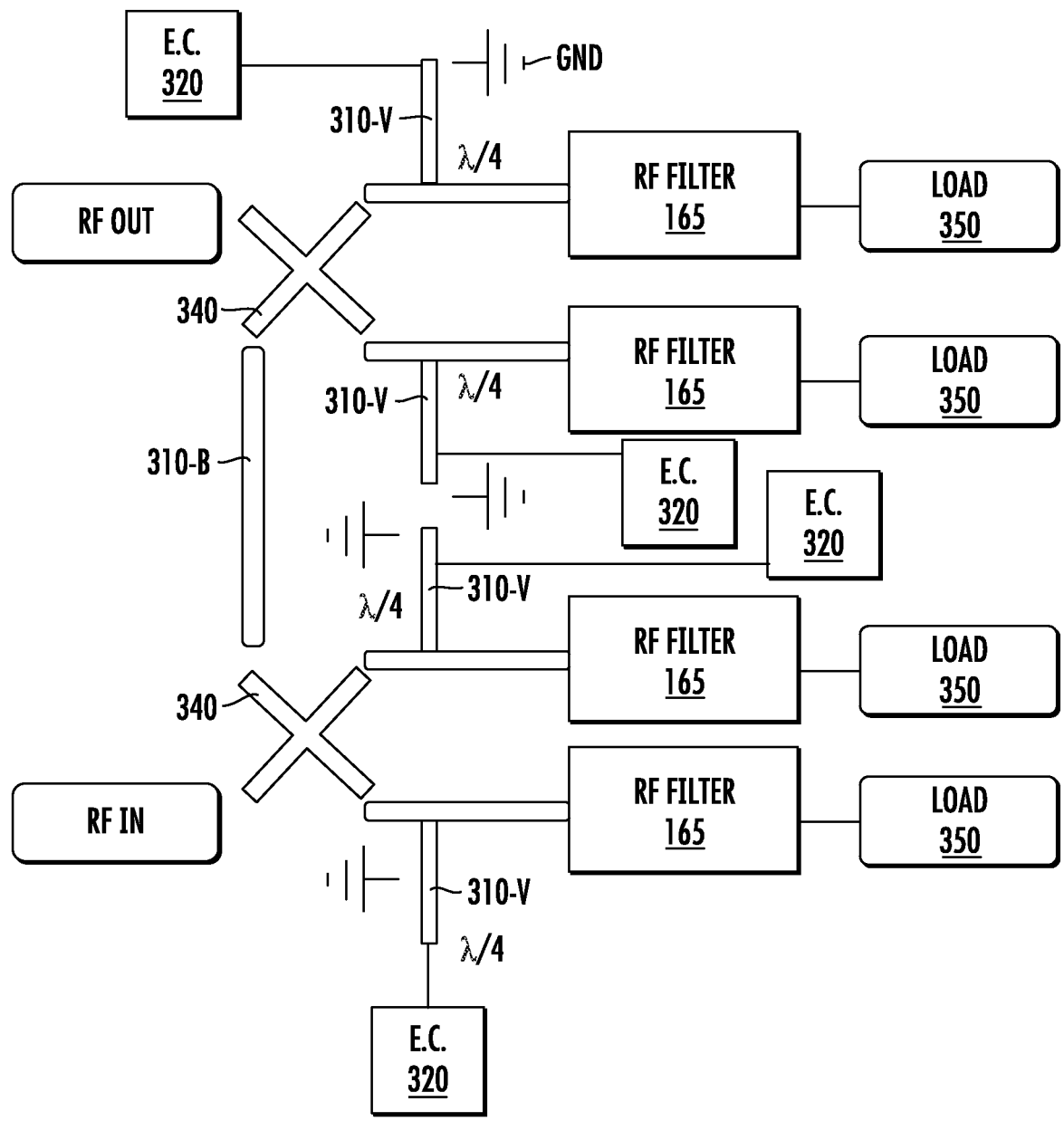

Referring to FIG. 3C, a device that includes multiple bypassable RF filters 165 is shown. Each filter 165 may be coupled to a load 350. For example, the load 350 may be a resistive load, such as a 50-Ohm load, that absorbs energy passing through the filter 165. Two or more filters 165 may be coupled to an RF coupler 340, which is itself coupled between an RF signal input RF IN and an RF signal output RF OUT of the device. As an example, the coupler 340 may be a 3 dB coupler.

Moreover, the coupler 340 and the filters 165 coupled thereto may provide a filter stage. In some embodiments, the device may have multiple filter stages, such as the two filter stages that are shown in FIG. 3C. In other embodiments, the device may have a single filter stage. To achieve an aggregate attenuation (e.g., return loss) of about 30 dB, each filter stage shown in FIG. 3C may provide about 17 dB of attenuation. For example, each filter 165 may be configured to provide about 17 dB of attenuation, such as to reject frequencies between 3.82 GHz and 3.9 GHz. A single-stage device may provide lower insertion loss, in addition to lower return loss, relative to a dual-stage device. Moreover, insertion loss may be lower when either the single-stage device or the dual-stage device operates in a mode (FIG. 3D) that bypasses the filters 165. The single-stage and dual-stage devices may also, in some embodiments, provide lower insertion loss than a device that uses solid-state switches for filter bypassing.

Each filter 165 may be coupled to a respective electronic (and/or mechanical) component 320, which may be, for example, a phase shifter 320P (FIG. 3A) or a PIN diode 320D (FIG. 3E). The component 320 may add or subtract electrical length to/from a respective adjustable-length RF transmission line 310-V that is coupled between the filter 165 and the coupler 340.

For example, in a first mode (FIG. 3C) of the device, each line 310-V may have an electrical length of one-quarter of a wavelength of an RF signal at the input RF IN, and the RF signal may be provided to each filter stage. As a result, each line 310-V may operate/function as an open-circuit point that does not interrupt a respective filter 165 that is coupled thereto. Each filter 165 may be configured to reflect RF energy in a first frequency band (e.g., the 3.7-3.8 GHz band) while passing RF energy in a second frequency band (e.g., the 3.82-3.98 GHz band) to a resistive load 350. Thus, if the filters 165 are not bypassed, then RF energy in the second frequency band is passed to the resistive loads 350 where it is dissipated.

In contrast, in a second mode (FIG. 3D) of the device, the electrical length of each line 310-V may be changed in response to a signal/setting at the component 320. As an example, the electrical length may be doubled to one-half of the wavelength. As a result, the RF signal at the input RF IN may be fully (or almost fully) reflected to the output RF OUT. In particular, each line 310-V may provide full (or almost full) reflection that interrupts an RF path to a respective filter 165. Because of this full (or almost full) reflection, the filters 165 may be disabled (i.e., electrically disconnected).

The components 320 may be coupled to one or more actuators 330 (FIG. 3A), which are omitted from view in FIGS. 3C-3H for simplicity of illustration. For example, an actuator 330 may provide a signal to a component 320 to adjust a setting thereof.

Figure 3D:
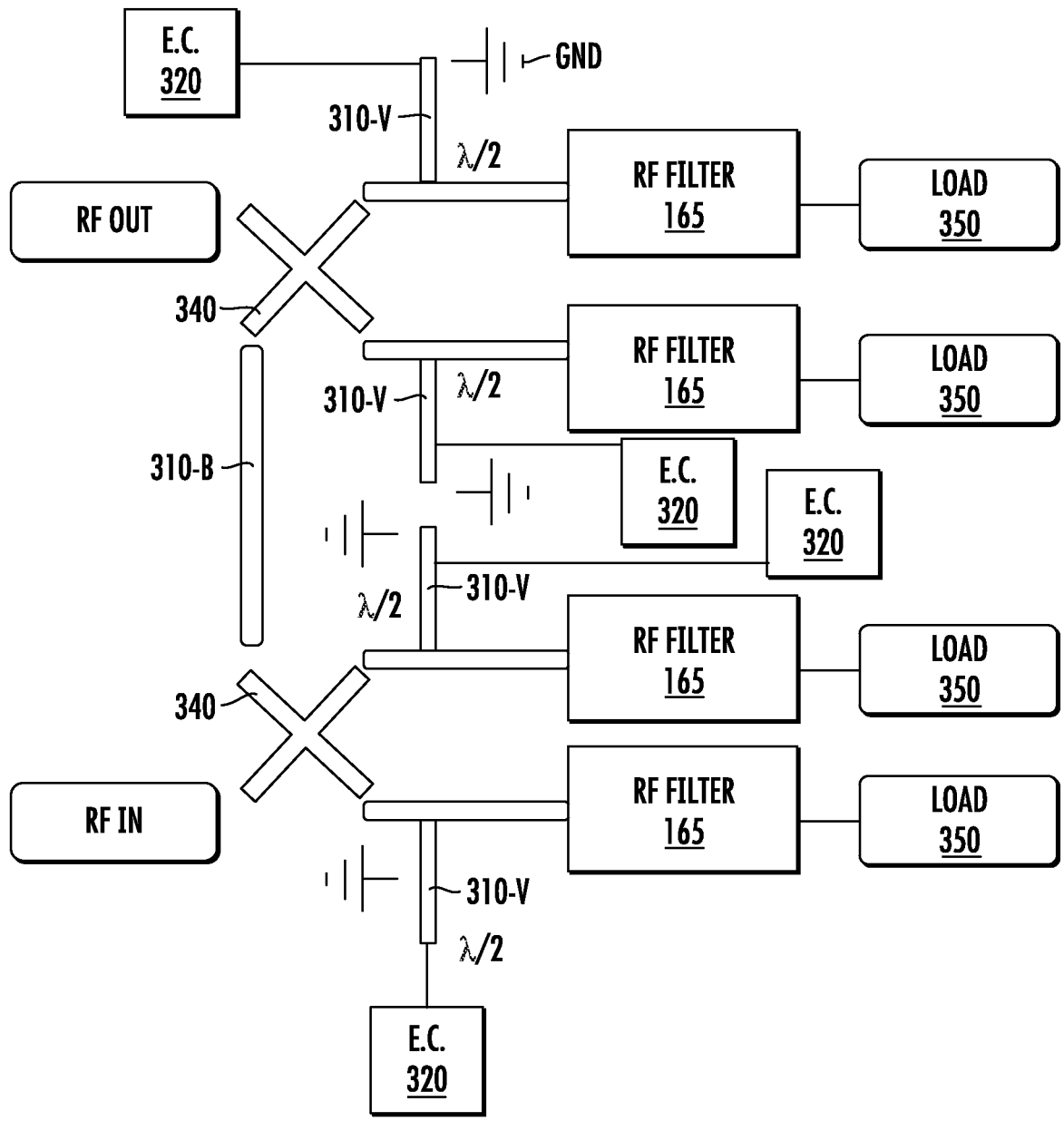

Referring to FIGS. 3C and 3D together, an example sequence is shown in which electrical lengths of the lines 310-V change by one-quarter of a wavelength. FIGS. 3C and 3D illustrate through-filter and bypass modes, respectively, and the sequence of transitioning between these two modes can begin with either mode and finish with the other.

Referring to FIG. 3E, a device including an adjustable-length RF transmission line 310-V that is coupled between an electronic (and/or mechanical) component 320 and an RF circulator 360 is shown. The circulator 360 may be adjacent and coupled to an RF signal input RF IN or an RF signal output RF OUT. In some embodiments, respective circulators 360 may be adjacent and coupled to the input RF IN and the output RF OUT. Moreover, a bypassable RF filter 165 may be coupled between the circulators 360, and the component 320 may be, for example, a PIN diode 320D or a phase shifter 320P (FIG. 3A).

In a first mode (FIG. 3E) of the device, the line 310-V may provide an electrical short circuit to ground GND, thus facilitating full (or almost full) reflection at the line 310-V and interrupting (e.g., creating an electrical disconnection in) a bypass path that includes two fixed-length RF transmission lines 310-F that are coupled to the line 310-V. As a result, an RF signal at the input RF IN is reflected to the filter 165.

By contrast, in a second mode (FIG. 3F) of the device, the RF signal bypasses the filter 165 and instead passes through the lines 310-F to the output RF OUT. For example, the lines 310-F may have a constant electrical length of an odd integer multiple of one-quarter of a wavelength of the RF signal at the input RF IN, whereas an electrical length of the line 310-V may change from an even integer multiple of one-quarter of the wavelength (e.g., from one-half of the wavelength) in the first mode (FIG. 3E) to an odd integer multiple of one-quarter of the wavelength in the second mode (FIG.

3F) in response to a signal/setting at the component 320. As a result, the line 310-V may operate/function as an open circuit that does not interrupt the bypass path that includes the two lines 310-F.

Figure 3F:
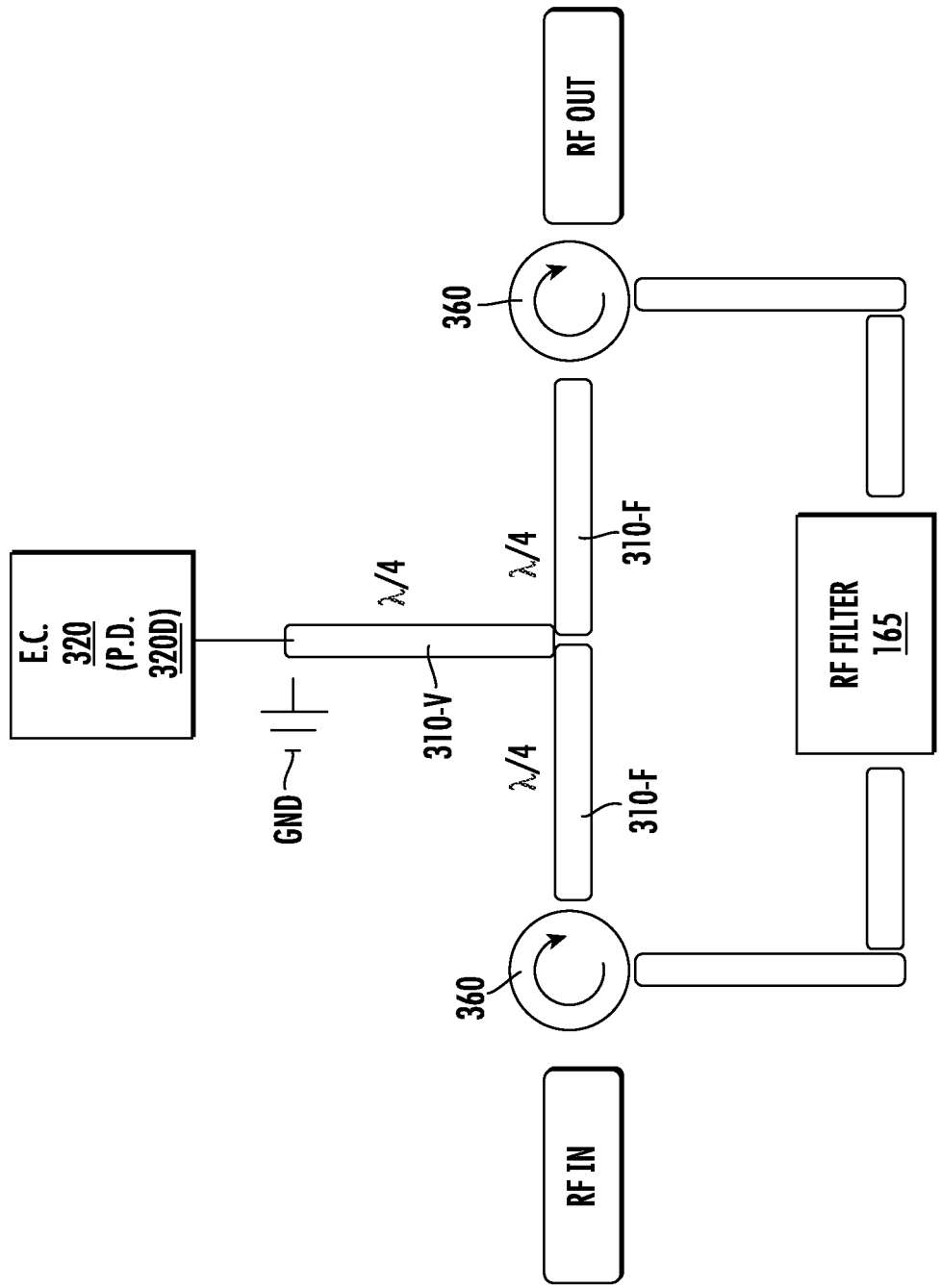

Referring to FIGS. 3E and 3F together, an example sequence is shown in which electrical lengths of the lines 310-V change by one-quarter of a wavelength. FIGS. 3E and 3F illustrate through-filter and bypass modes, respectively, and the sequence of transitioning between these two modes can begin with either mode and finish with the other.

Figure 3G:
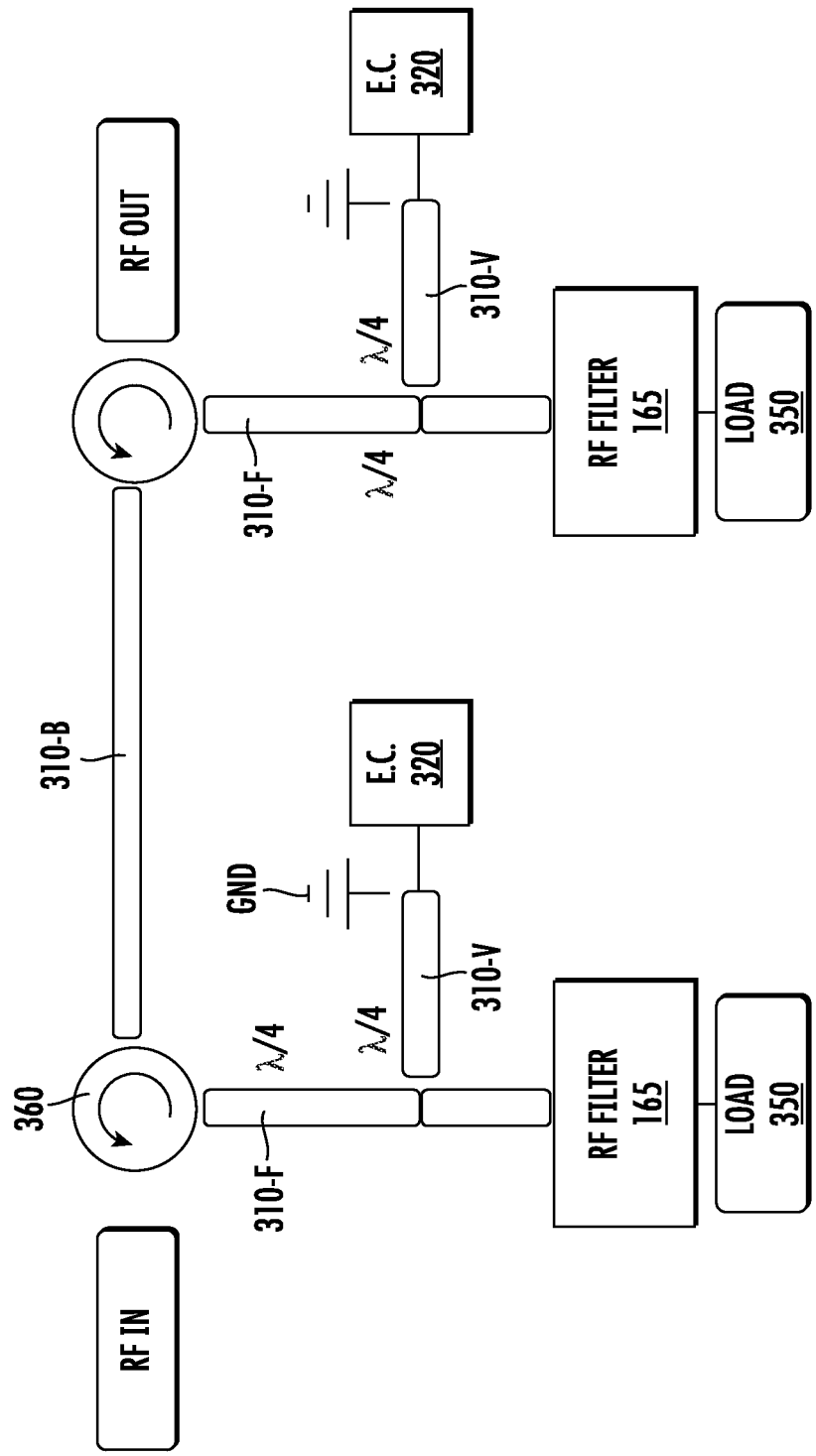

Referring to FIG. 3G, a device including multiple bypassable RF filters 165 and multiple RF circulators 360 is shown. A respective adjustable-length RF transmission line 310-V is coupled between each filter 165 and a respective circulator 360. Moreover, electronic (and/or mechanical) components 320 may be coupled to the lines 310-V, respectively. Each component 320 may be, for example, a PIN diode 320D (FIG. 3E) or a phase shifter 320P (FIG. 3A).

In a first mode (FIG. 3G) of the device, the lines 310-V and fixed-length RF transmission lines 310-F may be odd integer multiples of the same electrical length (e.g., odd integer multiples of a quarter-wavelength). As a result, an RF signal at an RF signal input RF IN is routed to the filters 165.

By contrast, in a second mode (FIG. 3H) of the device, each line 310-V between a line 310-F and a respective filter 165 may provide full (or almost full) reflection, thus electrically disconnecting the filters 165. As a result, the RF signal bypasses the filters 165 and instead passes to the output RF OUT. For example, the lines 310-F may have a constant electrical length of an odd integer multiple of one-quarter of a wavelength of the RF signal at the input RF IN, whereas an electrical length of the line 310-V may change from one-quarter of the wavelength in the first mode (FIG. 3G) to one-half of the wavelength in the second mode (FIG. 3H) in response to signals/settings at the components 320.

In some embodiments, the RF signal is routed to the filters 165 only during a downlink (i.e., transmission) mode of the antenna 100 (FIG. 1A). By contrast, in an uplink (i.e., reception) mode, the RF signal may be routed through the circulators 360 with lower insertion loss.

Figure 3H:
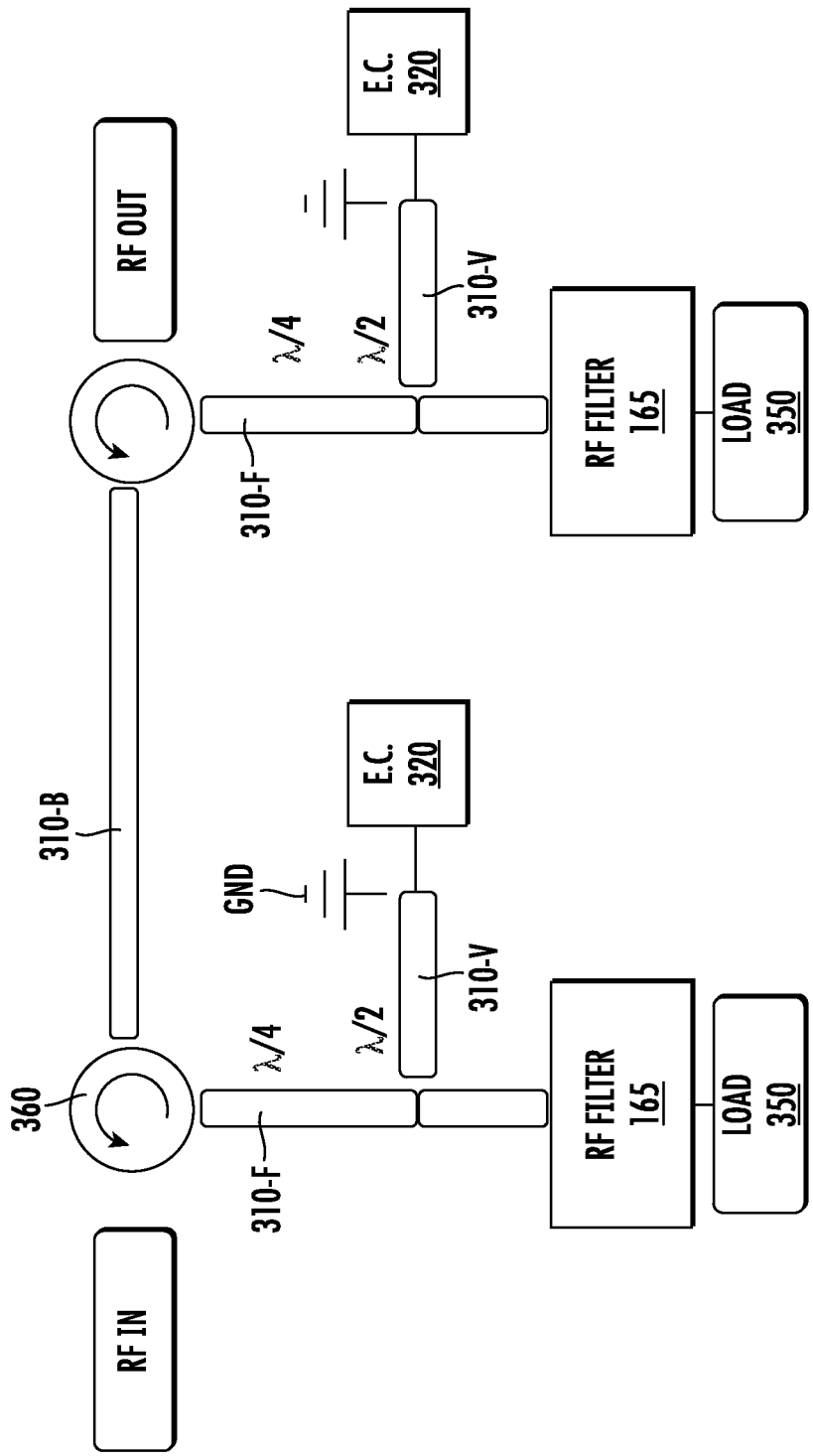

Referring to FIGS. 3G and 3H together, an example sequence is shown in which electrical lengths of the lines 310-V change by one-quarter of a wavelength. FIGS. 3G and 3H illustrate through-filter and bypass modes, respectively, and the sequence of transitioning between these two modes can begin with either mode and finish with the other.

FIGS. 4A and 4B are example schematic block diagrams illustrating a sequence of operating a device that includes one of the RF filters 165 of FIG. 1C. As shown in FIG. 4A, the device includes first and second RF transmission paths between an RF signal input RF IN and an RF signal output RF OUT. A bypassable RF filter 165 is coupled between two RF transmission lines 310 in the first path, whereas the second path comprises a bypass RF transmission line 310-B that bypasses the filter 165. Moreover, a phase shifter 320P (or wiper-arm switch) is coupled between the input RF IN and both of the paths, and another phase shifter 320P (or wiper-arm switch) is coupled between the output RF OUT and both of the paths.

The phase shifters 320P (or wiper-arm switches) are configured to switch between coupling the input RF IN and the output RF OUT, respectively, to (i) the first path and (ii) the second path. For example, FIG. 4A illustrates that respective wiper arms 320P-A of the phase shifters 320P (or wiper-arm switches) are each in a first position in which the wiper arms 320P-A are coupled to the first path that includes the filter 165.

Referring to FIG. 4B, the wiper arms 320P-A have been moved from the first position that is shown in FIG. 4A to a second position in which the wiper arms 320P-A are coupled to the second path that bypasses the filter 165. The first and second positions may be, for example, 90 degrees apart from each other, and thus may be different settings of the phase shifters 320P. Movement of the wiper arms 320P-A may be controlled by one or more actuators 330 (FIG. 4A). As an example, one or more RET actuators may control the wiper arms 320P-A to concurrently switch between the first position and the second position. For simplicity of illustration, the actuator(s) 330 are omitted from view in FIG. 4B.

Though phase shifters 320P are shown in FIGS. 4A and 4B, other electronic/mechanical components 320, such as PIN diodes 320D (FIG. 3E) or gallium nitride ("GaN") switches, may be used to switch between the first and second paths. For example, a PIN diode 320D may be used along with a quarter-wavelength RF transmission line segment that the PIN diode 320D can selectively (a) add or (b) not add electrical length to the lines 310 that are coupled to the filter 165. In some embodiments, the PIN diode 320D may be used for multiple-input, multiple-output ("MIMO") operations, as its performance may be stronger for MIMO operations than for some high-power operations. As another example, each wiper arm 320P-A that is shown in FIGS. 4A and 4B may be a wiper arm of a respective wiper-arm switch that (unlike a typical wiper-arm phase shifter) does not have a built-in transmission line.

Moreover, an electronic/mechanical component 320 may be a component other than a solid-state switch and other than an electromechanical relay. A solid-state switch may disadvantageously require a DC feed and introduce significant spurious and insertion losses. Also, an electromechanical relay may be prone to reliability problems.

Figure 5:
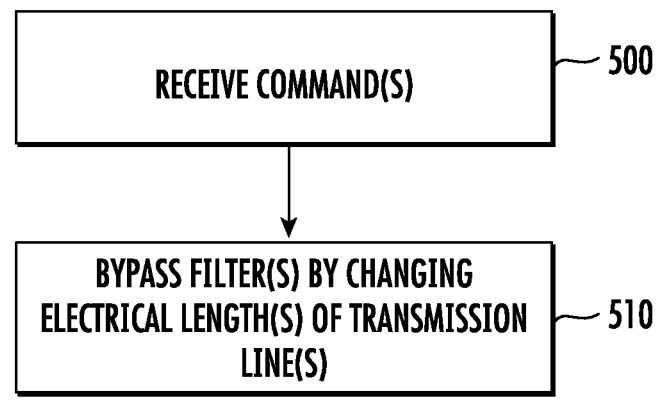
FIG. 5 is a flowchart illustrating operations of bypassing one or more of the RF filters of FIG. 1C, according to embodiments of the present inventive concepts.

FIG. 5 is a flowchart illustrating operations of bypassing one or more of the RF filters 165 of FIG. 1C, according to embodiments of the present inventive concepts. The operations may include bypassing (Block 510) the filter(s) 165 by changing an electrical length of at least one adjustable-length RF transmission line 310-V (FIGS. 3A-3H) that is coupled to the filter(s) 165. For example, a setting of a respective electronic/mechanical component 320 (FIGS. 3A-3H) that is coupled to each line 310-V may be adjusted to change the electrical length by 90 degrees. Moreover, the change may, in some embodiments, be performed in response to receiving (Block 500) a command signal, such as an AISG command that is received at the component 320 and/or at an actuator 330 (FIG. 3A) that is coupled thereto.

Devices having bypassable RF filters 165 (FIGS. 3A-4B) according to embodiments of the present inventive concepts may provide a number of advantages. These advantages include remotely bypassing the filters 165, such as by using AISG commands, rather than requiring technicians to manually bypass the filters 165, such as by physically accessing antennas and/or antenna towers having the filters 165. For example, an electronic/mechanical component 320 (FIG. 3A) may change (e.g., in response to an AISG command) the electrical length of an adjustable-length RF transmission line 310-V (FIG. 3A), thereby either (a) routing RF signals through a filter 165 or (b) bypassing the filter 165. In some embodiments, the component 320 may be neither a solid-state switch nor an electromechanical relay, and thus may reduce current consumption and interference (e.g., relative to the solid-state switch) and/or improve reliability (e.g., relative to the electromechanical relay).

The present inventive concepts have been described above with reference to the accompanying drawings. The present inventive concepts are not limited to the illustrated embodiments. Rather, these embodiments are intended to fully and completely disclose the present inventive concepts to those skilled in this art. In the drawings, like numbers refer to like elements throughout. Thicknesses and dimensions of some components may be exaggerated for clarity.

Spatially relative terms, such as "under," "below," "lower," "over," "upper," "top," "bottom," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the example term "under" can encompass both an orientation of over and under. The device may be otherwise oriented (rotated 90 degrees or at other orientations) and the spatially relative descriptors used herein interpreted accordingly.

Herein, the terms "attached," "connected," "interconnected," "contacting," "mounted," "coupled," and the like can mean either direct or indirect attachment or coupling between elements, unless stated otherwise.

Well-known functions or constructions may not be described in detail for brevity and/or clarity. As used herein the expression "and/or" includes any and all combinations of one or more of the associated listed items.

The terminology used herein is for the purpose of describing particular embodiments only and is not intended to be limiting of the present inventive concepts. As used herein, the singular forms "a," "an," and "the" are intended to include the plural forms as well, unless the context clearly indicates otherwise. It will be further understood that the terms "comprises," "comprising," "includes," and/or "including" when used in this specification, specify the presence of stated features, operations, elements, and/or components, but do not preclude the presence or addition of one or more other features, operations, elements, components, and/or groups thereof.

That which is claimed is:

1. A device, comprising:
   a radio frequency (RF) signal input and an RF signal output;
   a bypassable RF notch filter that is coupled between the RF signal input and the RF signal output, the filter being configured to reject RF signals in a predefined frequency band;
   an adjustable-length RF transmission line that is coupled to the bypassable RF filter; and
   an electronic component that is coupled to the adjustable-length RF transmission line and is configured to change an electrical length of the adjustable-length RF transmission line between a first length and a second length,
   wherein the device is configured to provide an RF signal that bypasses the bypassable RF filter when the adjustable-length RF transmission line has the second length and that does not bypass the bypassable RF filter when the adjustable-length RF transmission line has the first length.

2. The device of claim 1, wherein the electronic component comprises a phase shifter.

3. The device of claim 1, wherein the electronic component comprises a PIN diode.

4. The device of claim 1, wherein the second length is double the first length or half of the first length.

5. The device of claim 1,
   wherein the adjustable-length RF transmission line comprises a first of a plurality of adjustable-length RF transmission lines that are coupled to the bypassable RF notch filter, and
   wherein the electronic component comprises a first of a plurality of electronic components that are coupled to and configured to change electrical lengths of the adjustable-length RF transmission lines, respectively.

6. The device of claim 1, further comprising a resistive load that is coupled to the bypassable RF notch filter.

7. The device of claim 1,
   wherein the bypassable RF notch filter comprises a first of a plurality of bypassable RF notch filters of a filter stage,
   wherein the filter stage further comprises a second of the bypassable RF notch filters.

8. The device of claim 7, further comprising an RF coupler that is coupled between the RF signal output and each of the first and the second of the bypassable RF notch filters.

9. The device of claim 7, wherein the filter stage comprises a first of a plurality of filter stages that are coupled between the RF signal input and the RF signal output.

10. The device of claim 1, further comprising an RF circulator that is coupled to the RF signal input or the RF signal output,
    wherein the adjustable-length RF transmission line is coupled between the RF circulator and the electronic component.

11. The device of claim 10,
    wherein the RF circulator is coupled to the RF signal input and comprises a first of a plurality of RF circulators, and
    wherein a second of the RF circulators is coupled to the RF signal output.

12. The device of claim 11, wherein the bypassable RF notch filter is coupled between the first and the second of the RF circulators.

13. The device of claim 11, wherein the adjustable-length RF transmission line is coupled between the bypassable RF notch filter and the first of the RF circulators.

14. The device of claim 13,
    wherein the adjustable-length RF transmission line comprises a first of a plurality of adjustable-length RF transmission lines,
    wherein the bypassable RF notch filter comprises a first of a plurality of bypassable RF notch filters, and
    wherein the device further comprises:
       a second of the bypassable RF notch filters; and
       a second of the adjustable-length RF transmission lines that is coupled between the second of the bypassable RF notch filters and the second of the RF circulators.

15. The device of claim 1, wherein the device is a base station antenna.

16. The device of claim 1, wherein the RF notch filter is configured to route signals through the filter during a first mode of operation and to bypass the filter during a second mode of operation.

17. A device, comprising:
first and second radio frequency (RF) transmission paths between an RF signal input and an RF signal output;
a bypassable RF filter that is in the first RF transmission path;
an RF circulator coupled to the RF signal input or the RF signal output; and
a component, other than a solid-state switch and other than an electromechanical relay, that is coupled between the RF signal input and both of the first and second RF transmission paths,
wherein the component is configured to switch between coupling the RF signal input to the first RF transmission path and coupling the RF signal input to the second RF transmission path.

18. The device of claim 17,
wherein the component comprises a first component,
wherein the device further comprises a second component that is coupled between the RF signal output and both of the first and second RF transmission paths, and
wherein the second component is configured to switch between coupling the RF signal output to the first RF transmission path and coupling the RF signal output to the second RF transmission path.

19. The device of claim 18, wherein the second component is configured to switch concurrently with the first component.

20. The device of claim 17, wherein the component comprises a PIN diode or a switch comprising a wiper arm.

21. A base station antenna, comprising:
a plurality of radiating elements;
a bypassable radio frequency (RF) notch filter that is coupled to a first of the radiating elements and can route signals through the filter during a first mode of operation and can bypass the filter during a second mode of operation, the RF notch filter being configured to reject RF signals in a predefined frequency band;
an adjustable-length RF transmission line that is coupled to the bypassable RF filter; and
a component that is coupled to the adjustable-length RF transmission line and is configured to change an electrical length of the adjustable-length RF transmission line between a first length and a second length,
wherein the base station antenna is configured to provide an RF signal that bypasses the bypassable RF filter when the adjustable-length RF transmission line has the second length and that does not bypass the bypassable RF filter when the adjustable-length RF transmission line has the first length.

* * * * *